(12) United States Patent
Shi et al.

(10) Patent No.: US 6,538,195 B1
(45) Date of Patent: Mar. 25, 2003

(54) THIN FILMS WITH LIGHT TRAPPING

(75) Inventors: Zhengrong Shi, Shanghai (CN); Stuart Ross Wenham, Menai Heights (AU); Martin Andrew Green, Bronte (AU); Paul Alan Basore, Caringbah (AU); Jing Jia Ji, Croydon (AU)

(73) Assignee: Pacific Solar Pty Limited, New South Wales (AU)

( * ) Notice: Subject to any disclaimer, the term of this patent is extended or adjusted under 35 U.S.C. 154(b) by 0 days.

(21) Appl. No.: 09/831,236

(22) PCT Filed: Nov. 8, 1999

(86) PCT No.: PCT/AU99/00979

§ 371 (c)(1),
(2), (4) Date: May 31, 2001

(87) PCT Pub. No.: WO00/28602

PCT Pub. Date: May 18, 2000

(30) Foreign Application Priority Data

Nov. 6, 1998 (AU) .............................. PP6997

(51) Int. Cl.⁷ ..................... H01L 31/0236; H01L 31/06; H01L 31/18
(52) U.S. Cl. ..................... 136/259; 136/256; 136/258; 136/261; 438/71; 438/69; 438/72; 438/96; 438/97; 257/436; 257/437; 257/464
(58) Field of Search .............................. 136/259, 256, 136/258, 261; 438/71, 69, 72, 96, 97; 257/436, 437, 464

(56) References Cited

U.S. PATENT DOCUMENTS

| | | | | |
|---|---|---|---|---|
| 4,554,727 A | * | 11/1985 | Deckman et al. | 136/258 |
| 4,644,091 A | * | 2/1987 | Hayashi et al. | 136/259 |
| 4,719,501 A | | 1/1988 | Nakagawa et al. | |
| 4,732,621 A | | 3/1988 | Murata et al. | |
| 4,829,013 A | * | 5/1989 | Yamazaki | 437/71 |
| 4,956,685 A | | 9/1990 | Fischer et al. | |

FOREIGN PATENT DOCUMENTS

| | | |
|---|---|---|
| EP | 0137291 | 4/1985 |
| WO | WO88/09265 | 12/1988 |
| WO | WO 97/19473 A1 * | 5/1997 |

* cited by examiner

*Primary Examiner*—Alan Diamond
(74) *Attorney, Agent, or Firm*—Jordan and Hamburg LLP

(57) ABSTRACT

A thin film silicon solar cell is provided on a glass substrate, the glass having a textured surface, including larger scale surface features and smaller scale surface features. Over the surface is deposited a thin barrier layer which also serves as an anti-reflection coating. The barrier layer may be a silicon nitride layer for example and will be 70 nm±20% in order to best achieve its anti-reflection function. Over the barrier layer is formed an essentially conformal silicon film having a thickness which is less than the dimensions of the larger scale features of the glass surface and of a similar dimension to the smaller scale features of the glass surface.

42 Claims, 5 Drawing Sheets

THIN FILMS WITH LIGHT TRAPPING

INTRODUCTION

The present invention relates generally to thin film photovoltaic devices and in particular the invention provides a structure and a method of forming the structure for thin film cells to achieve light trapping in these cells.

BACKGROUND OF THE INVENTION

The use of light trapping is well know in monocrystalline silicon cells where light trapping features in the surface of the cell have dimensions which are much less than the thickness of silicon substrate of the device and significantly greater than the wavelength of light in air.

In solar cells, light scattering is used to trap light in the active region of the cell. The more light that is trapped in the cell, the higher the efficiency that can be obtained. Therefore, light trapping is an important issue when trying to improve efficiency in solar cells and is particularly important in thin film cell design.

However it has been widely thought that in thin film devices where the active silicon layers are thin films formed over a substrate such as glass, light trapping would not be possible or at least demonstrate reduced effectiveness. This is because the film thicknesses are of the same order of magnitude or thinner than the dimension of light trapping features in known monocrystalline devices. As film thicknesses in thin film devices are reduced, they tend toward conformal coatings having predominantly parallel surfaces over the etched surface of the glass substrate and conventional thinking would be that such an arrangement does not achieve significant advantages from light trapping. Also as film thicknesses are reduced to the order of a wavelength (in air) or thinner conventional thinking is that the mechanisms providing light trapping in prior art devices would cease to be effective.

This is born out in prior art thin film amorphous silicon solar cell devices where no deliberate attempt at texturing was made. Present day amorphous silicon devices typically comprise a glass superstrate over which is layed a Transparent Conductive Oxide (TCO) contact layer and a thin amorphous silicon film (1 $\mu$m) active layer including a p-n junction and a rear metallic layer acting as a reflector and back contact. When such structures were first devised it was noticed that in some circumstances (when the surface of the TCO was cloudy) cell performance was greater than expected but the literature offered no explanation as to the reason for such unexpected performance.

It has now become apparent to the present inventors that light trapping is possible in thin film devices and the prior art amorphous silicon devices were in fact demonstrating a characteristic that the present inventors have now identified and adapted to crystalline silicon thin film cells. Central to the invention is the realisation that the wavelength of light of a given frequency is different in silicon and air.

The present inventors have now identified the circumstances under which light trapping can be achieved in thin films and in particular the inventors have devised methods for manufacture of thin film crystalline silicon solar cell structures which exhibit light trapping characteristics.

SUMMARY OF THE INVENTION

According to a first aspect, the present invention provides a method of forming a light trapping structure in a thin film silicon solar cell formed on a glass substrate or superstrate, the method including the steps of:
  a) etching a surface of the glass substrate or superstrate to provide a textured surface; and
  b) forming a silicon film on the textured surface and forming a photovoltaic device structure in the silicon film, the silicon film being less than 10 $\mu$m thick.

According to a second aspect, the present invention provides a thin film photovoltaic device incorporating a light trapping structure, wherein the photovoltaic device is formed on a textured surface of a glass substrate or superstrate, the photovoltaic device comprising a thin silicon film into which is formed at least one pn photovoltaic junction, the silicon film being less than 10 $\mu$m thick.

The invention is applicable to both crystalline and amorphous silicon solar cells. In the case of amorphous silicon devices, a Transparent Conducting Oxide (TCO) layer will be formed immediately below the silicon film.

In embodiments of the invention, the textured surface of the glass preferably includes surface features having dimensions in the range of from 0.05–0.2 times the thickness of the silicon film. Preferably also, a thin conformal barrier layer is formed between the textured glass surface and the silicon film to prevent migration of contaminants from the glass to the silicon.

The barrier layer may also act as an anti-reflection layer and will in that case, be arranged to have a thickness equal to a quarter wavelength ±20% which in the case of silicon nitride is 70 nm±20%

The silicon film is typically less than 5 $\mu$m thick and preferably has a thickness of 2 $\mu$m or less. The silicon film is typically at least 0.5 $\mu$m or greater and preferably greater than 1 $\mu$m. Typically, the scale of textured surface features is in the range of 0.01–10 $\mu$m. The useful lower limit of the feature size is in the order of a wavelength of light in crystalline silicon and typically the useful lower limit is 0.05 $\mu$m. The texturing may also include large scale features which have dimensions greater than the thickness of the silicon film.

In some embodiments of the invention, the surface of the substrate is textured by an etching step, which is performed to form features in the substrate surface having a range of dimensions including dimensions which are greater than the thickness of the silicon film structure. In preferred embodiments these features are in the range of 1–5 $\mu$m on average and typically in the order of 2 $\mu$m.

Where such an etching step is employed it is performed in a manner to additionally provide small scale surface features which have dimensions significantly less than the thickness of the silicon film structure. Typically, the small scale surface features will vary in the range of 0.01–1 $\mu$m.

In one embodiment of the invention, the etching step is performed by applying an etching composition which includes HF or a derivative thereof to the glass surface to be etched.

The glass substrate, after etching using HF may be optionally subsequently heated to a temperature at which the glass softens and angular edges of the surface features are rounded. An application of a layer of spin-on glass, can also be used instead of thermal rounding of the etched glass surface.

In typical embodiments of the invention the back surface of the silicon film structure (ie, remote from the glass) has a reflective material formed over it. Typically, the reflective material will be a metallisation structure used to contact the active regions of the cell. The metallisation structure will in some embodiments, be separated from most of the silicon back surface by an insulating layer.

BRIEF DESCRIPTIONS OF THE DRAWINGS

Embodiments of the invention will now be described by way of example, with reference to the accompanying drawings in which.

DETAILED DESCRIPTION OF EMBODIMENTS OF THE INVENTION

Figure 1:
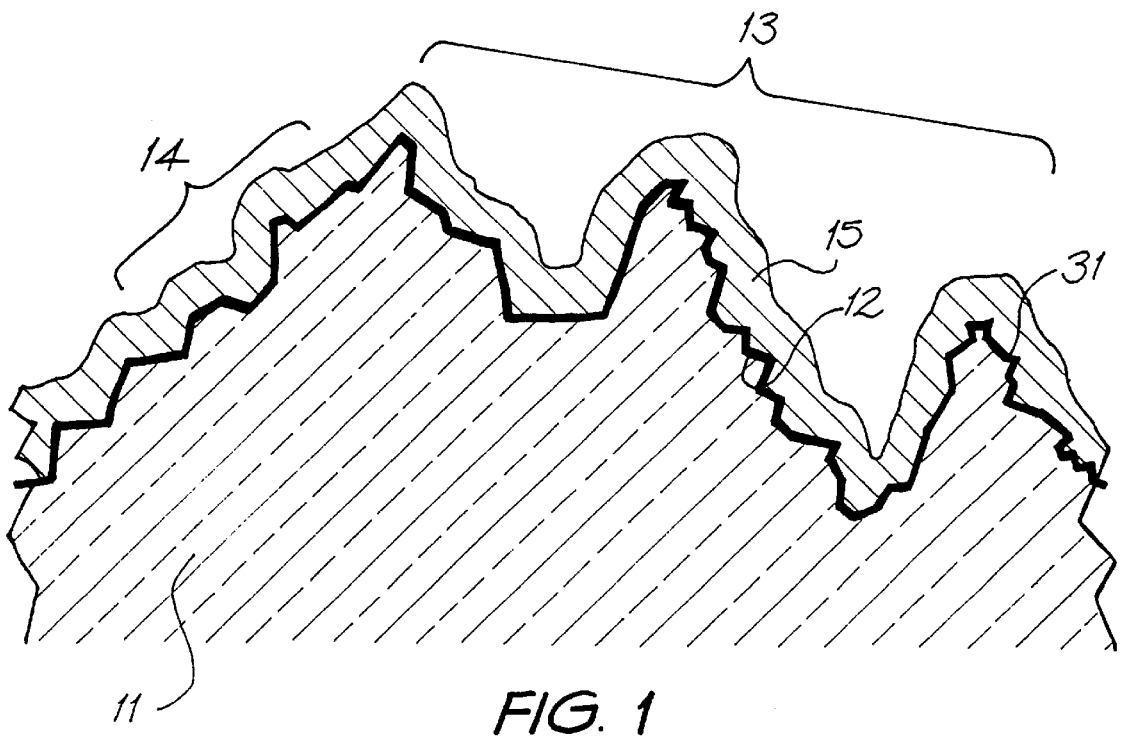
FIG. 1 is a sectional side view of a glass surface etched in accordance with a first embodiment, with a silicon layer formed over the etched surface.

Referring to FIG. 1, a detailed sectional side view of a small section of a glass sheet 11 is illustrated, the glass having a textured surface 12, including larger scale surface features 13 and smaller scale surface features 14. Over the surface 12 is deposited a thin barrier layer 31 which also serves as an anti-reflection coating. The barrier layer may be a silicon nitride layer for example and will be 70 nm±20% in order to best achieve its anti-reflection function. Over the barrier layer 31 is formed an essentially conformal silicon film 15 having a thickness which is less than the dimensions of the larger scale features of the glass surface and of a similar dimension to the smaller scale features of the glass surface. Typically, the larger dimension features 13 will have dimensions in the range of 1–10 μm. The smaller dimension features 14 will have dimensions in the range of 0.01–1 μm and the silicon film 15 will have a thickness in the range of 0.5–5 μm.

To achieve the structure of FIG. 1, the surface of the lass sheets is first cleaned and then etched with an etching composition containing HF or a derivative thereof. The etching composition also contains an additive such as Barium Sulphate ($BaSO_4$) which forms deposits on the surface of the glass 11 to be etched. The etching composition covers the surface of the glass to a significant depth (say 0.1–0.5 mm). During the etching process, deposits of Barium Sulphate crystals form on the surface of the glass 11, and mask the surface of the glass 11, such that the surface is selectively etched by the HF to form the larger scale features 13 and the smaller scale features 14 of FIG. 1.

Typical examples of formations of the etching composition are as follows:

EXAMPLE 1 (for Soft Glasses)

| A paste is made by mixing | |
|---|---|
| Barium Sulphate ($BaSO_4$) | 50 g |
| Ammonium BiFluoride ($NH_4$)$HF_2$ | 100 g |
| Water ($H_2O$) | 120 ml |

EXAMPLE 2 (for Soft Glasses)

| A paste is made by mixing | |
|---|---|
| Barium Sulphate ($BaSO_4$) | 75 g |
| Ammonium BiFluoride ($NH_4$)$HF_2$ | 75 g |
| Water ($H_2O$) | 100 ml |

EXAMPLE 3 (for Hard Glasses)

| A paste is made by mixing | |
|---|---|
| Barium Sulphate ($BaSO_4$) | 50 g |
| Hydrofluoric Acid 50% Solution (HF:$H_2O$) | 50 ml |

In one embodiment of the invention, after the glass has been etched, and the etchant cleaned off by washing, the silicon film 15 is formed on the surface prior to making a photovoltaic device.

Figure 3:
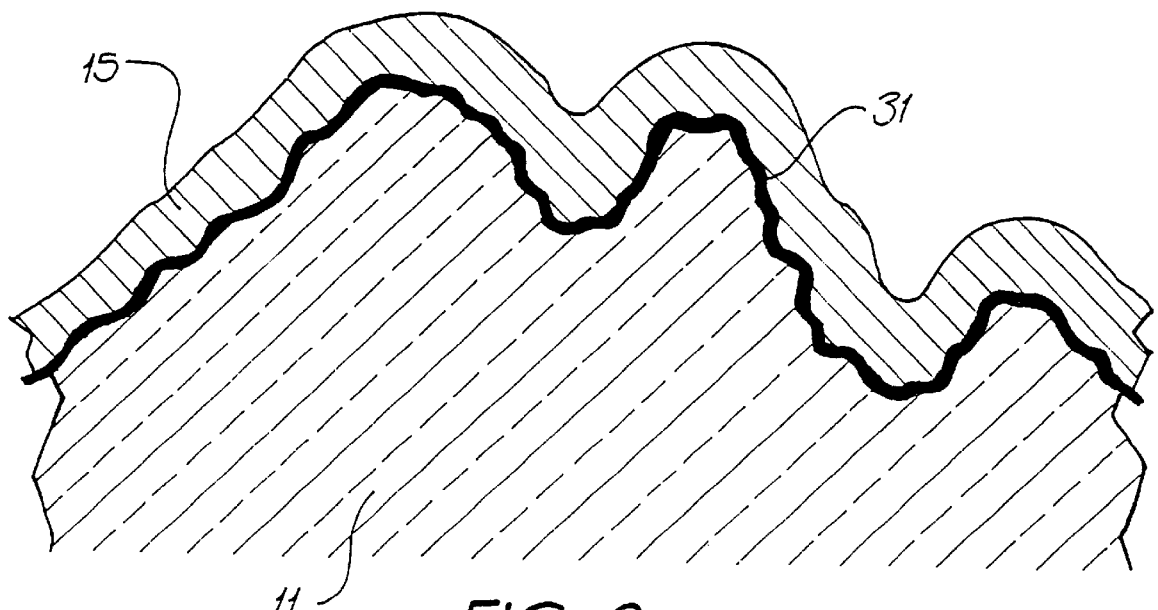
FIG. 3 is a sectional side view of a glass surface similar to that of FIG. 1, but to which a step of heating the glass to its softening point has been performed after the etching step and before the silicon layer was applied.

In an alternative embodiment, an additional step is performed after etching and prior to formation of the silicon film, in which the glass substrate is softened by heating to a point where sharp surface features are rounded as illustrated in FIG. 3. The sharper features of the surface texture can in some instances hinder the later processing of the photovoltaic cell structure created in the thin silicon film formed on the glass substrate. The rounding of these features reduces the difficulties created by the sharper surface features where shunting often occurs in thin film junctions formed on the textured surface due to the excessive thinning of the active layers over sharp peaks in the texturing. By heat treating the glass, the sharpness of the peaks is reduced with a resultant significant reduction in the occurrence of shunting in the completed device.

In the case of soft glasses, the heat treatment to round the surface features involves heating the glass, or at least the surface of the glass, to a temperature of 700° C. for a period of less than one hour and typically, for periods in the order of 15 minutes.

Figure 2:
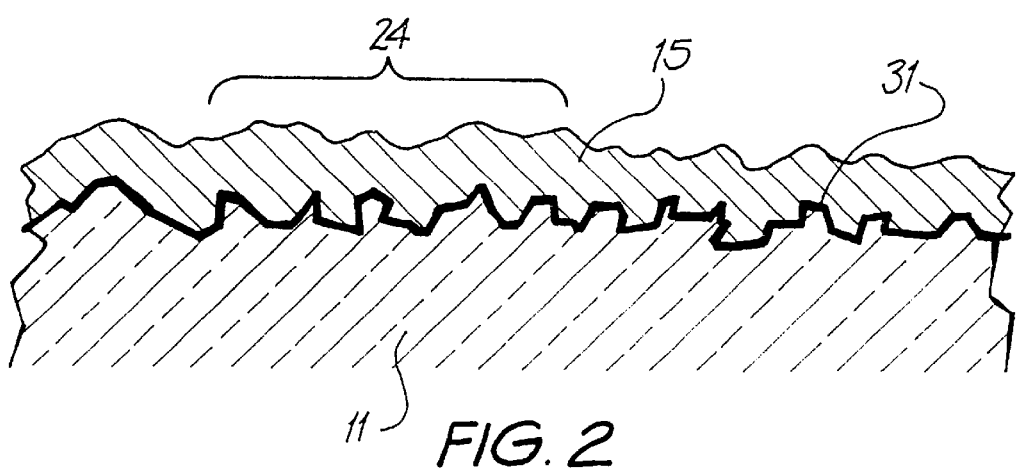
FIG. 2 is a sectional side view of a glass surface etched in accordance with a second embodiment, with a silicon layer formed over the etched surface.

Referring to FIG. 2, a detailed sectional side view of an alternative embodiment of the invention is illustrated in which a glass sheet 11 has a textured surface over which is formed a barrier layer 31 and a thin film of silicon 15. In this embodiment, the largest dimension of the surface texturing 24 is smaller than, or of the same order of magnitude as the thickness of the silicon film. Typically, in this embodiment, the largest dimension of the surface texturing is in the range of 0.1–1 μm, while the thin silicon film has a thickness in the range of 0.5–2 μm.

The surface texturing of the embodiment of FIG. 2, is achieved in a similar manner to that of the process used to achieve the FIG. 1 embodiment with smaller features being achieved by varying etch parameters such as etching solution composition, etching time/temperature and etching solution film thickness (ie, time to exhaustion).

Liquid formulations of the etching composition are achieved by adding water ($H_2O$) and/or hydrofluoric acid to any of the examples mentioned previously until the required strength and consistency is achieved.

Figure 4:
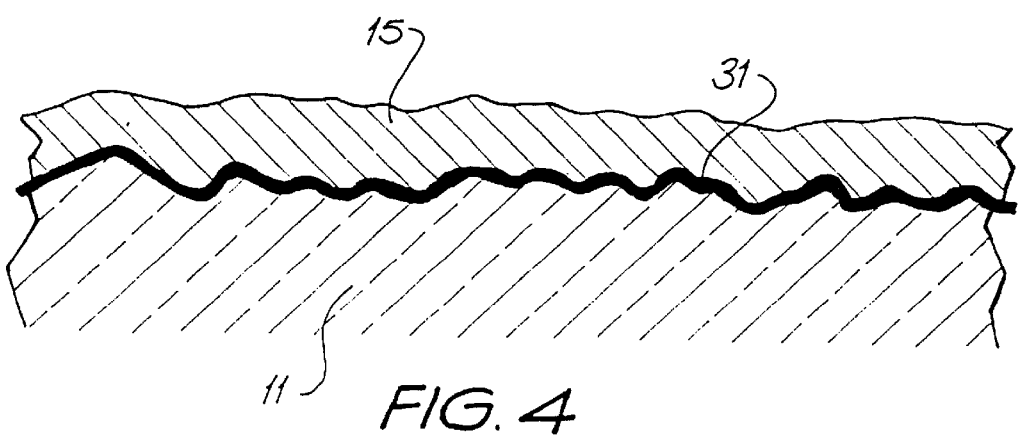
FIG. 4 is a sectional side view of a glass surface similar to that of FIG. 2, but to which a step of heating the glass to its softening point has been performed after the etching step and before the silicon layer was applied.

As with the previous embodiment, the etching composition is washed from the surface of the glass before the thin silicon film is formed over the textured surface. Referring to FIG. 4, a further alternative embodiment is illustrated in which the glass substrate has been softened by heating after etching as with the embodiments of FIG. 3, such that sharper surface features are rounded.

Figure 5:
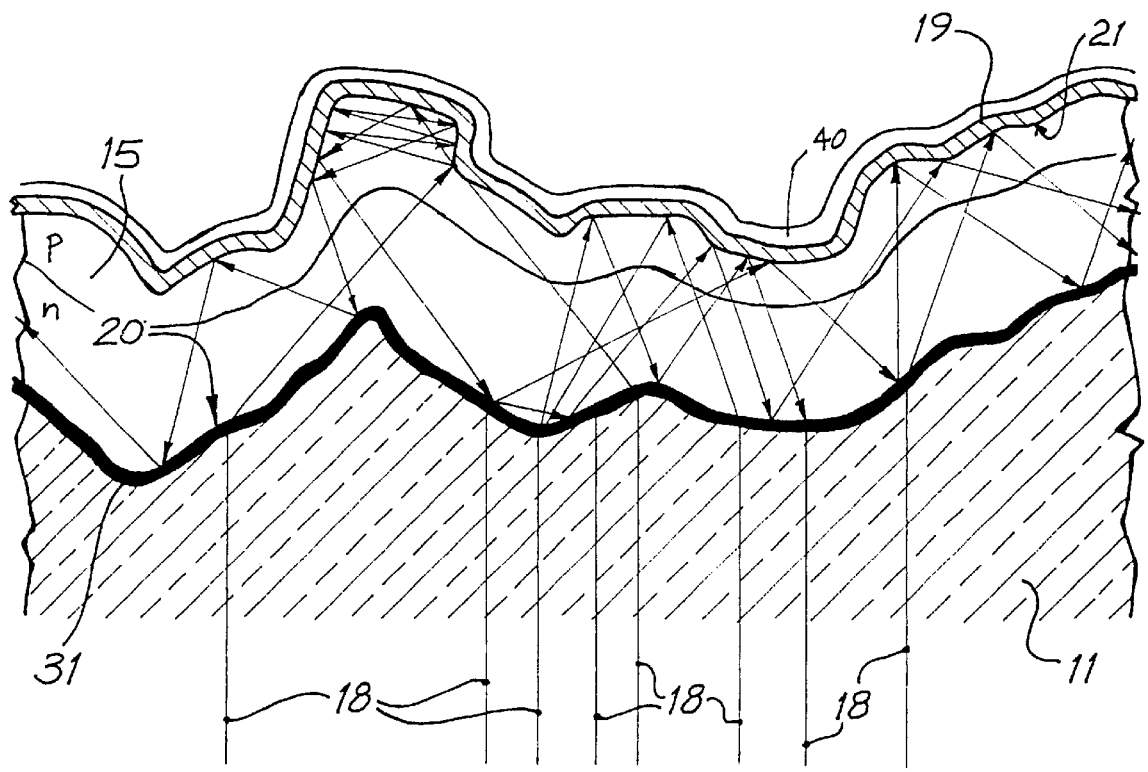
FIG. 5 is a sectional side view of a glass substrate with a textured surface layer and a thin film of silicon formed over its surface, illustrating representative paths of incident photons through the glass substrate, and the silicon layer.

Finally, as illustrated in FIG. 5, which is a sectional view of an embodiment similar to those of FIGS. 1–4, after the silicon has been formed and any processing required to be performed over the entire silicon layer has been completed, such as the formation of a dielectric layer 19, a metal layer 40 is applied over the silicon surface 36 to provide a back reflector and to be processed into contacts for contacting to the semiconductor device formed in the silicon film. The dielectric layer 19 is located between the silicon 15 and the metal layer 40 in order to isolate the metal from the upper region (p-type in this example) of the semiconductor film such that portions of the metal can be connected through to the lower region (n-type in this case) of the semiconductor film without shorting the p-n junction.

FIG. 5 also illustrates some possible paths of photons of light which enter or exit the silicon film 15. The photons travel along paths 18 through the substrate and are reflected within the silicon film 15, between the glass/silicon interface 20 (or anti-reflection layer/silicon interface) and the upper silicon/dielectric interface 21 or the metal (back contact) 19. By causing several reflections to occur, the photocurrent, and therefore the conversion efficiency, of a photovoltaic cell formed in the thin silicon film is increased.

Figure 6:
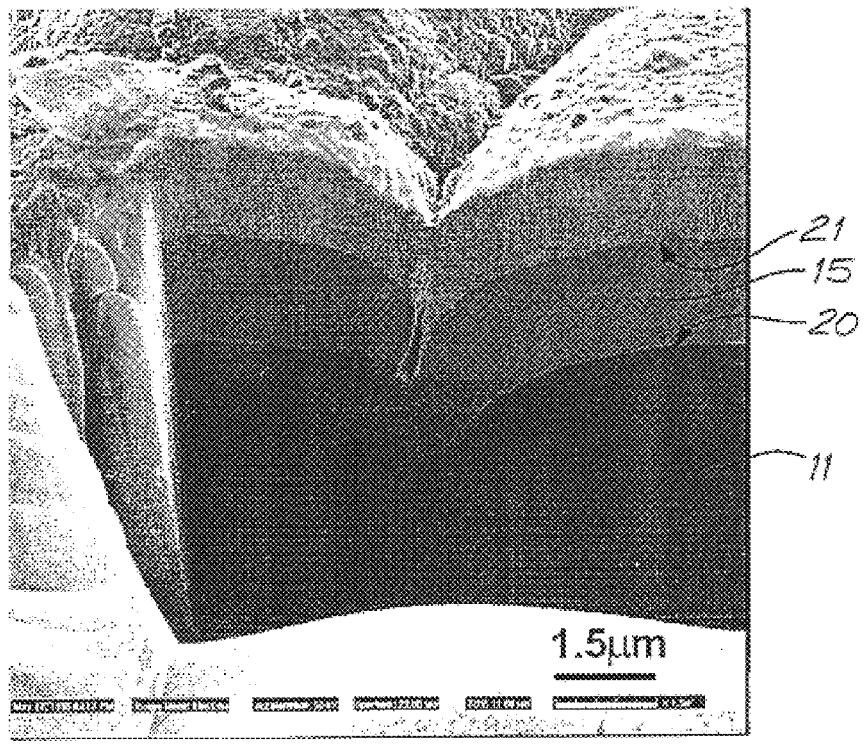
FIGS. 6 and 7 are photographs of sections through a thin silicon film formed over an etched glass surface in accordance with an embodiment of the invention.
Figure 7:
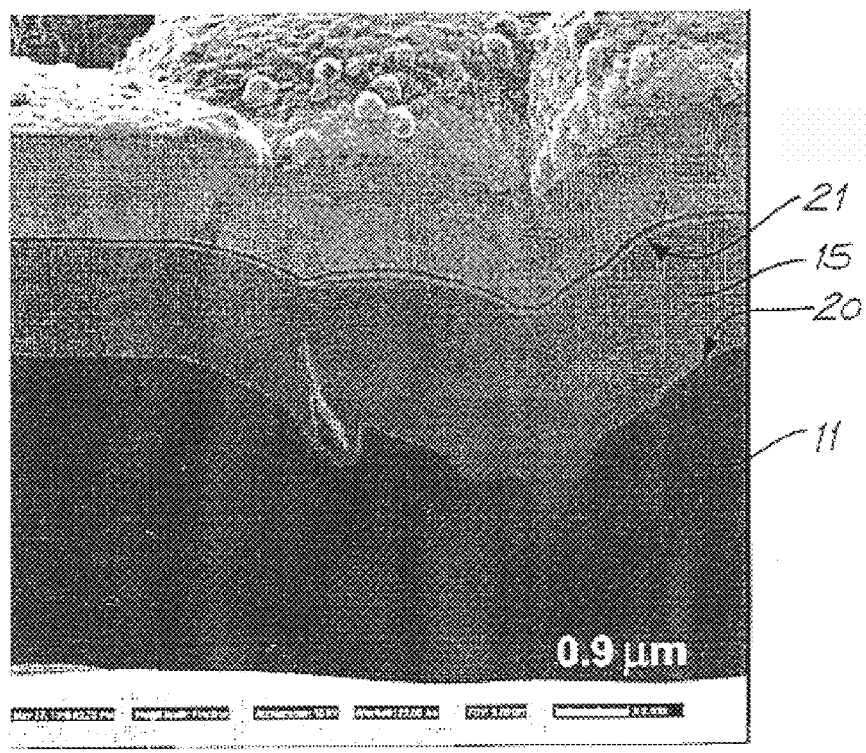

Referring to FIGS. 6 and 7, photographs of sections through actual thin film deposits 15 on textured surface glass 12 illustrate that while the silicon film 15 approximates a conformal coating, the surface texturing includes features which are less than the thickness of the silicon film 15 with the result that the two surfaces 20, 21 are not parallel. Because the surfaces are not parallel photons of light entering the thin silicon film 15 from the glass 11 at an angle to the surface 20 of the film will generally strike the opposite surface 21 at a point at which its angle of incidence is different to that at which it leaves surface 20. Assuming that the photon is reflected from surface 21 its angle of incidence when next meeting surface 20 will be different again with a high probability of total internal reflection occurring, such that the photon will, if it is not absorbed first, have a high probability of travelling through the thin film more than twice before escaping.

Figure 8:
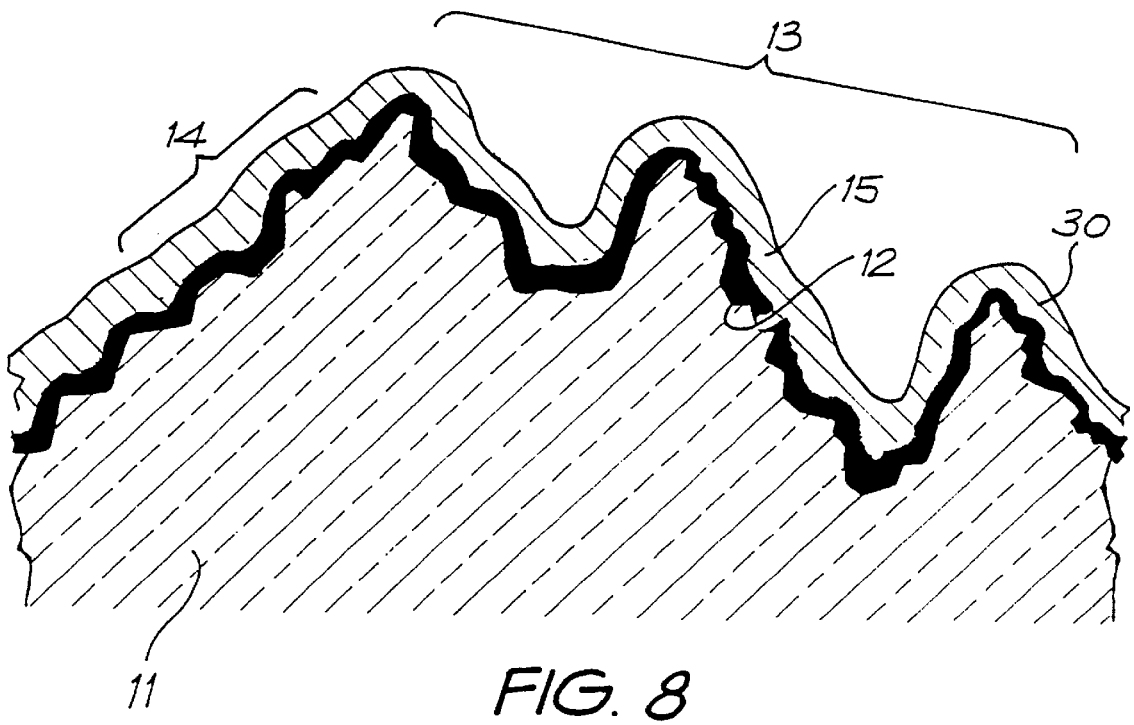
FIGS. 8 and 9 are sectional side views of embodiments similar to those of FIGS. 3 & 4, but in which a spin-on-glass layer has been employed instead of using thermal rounding.
Figure 9:
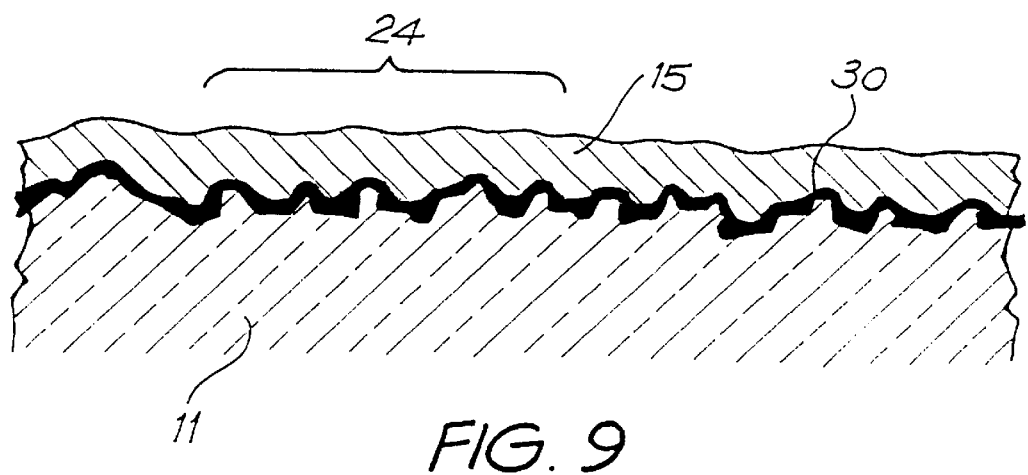

Alternative embodiments of the invention are illustrated in FIGS. 8 & 9 which are similar to the embodiments of FIGS. 3 & 4 except that instead of thermally rounding the surface of the glass 11 before applying the silicon 15, a spin-on glass layer 30 is applied in each case, whereby the valleys in the texturing are partially filled and the sharper features are rounded. The spin-on glass layer 30 also acts as a barrier layer, although in some instances a further anti-reflection layer (not shown) may also be used.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming a light trapping structure in a thin film silicon solar cell formed on a glass substrate or superstrate, the method including the steps of:
    a) etching a clean previously untextured surface of the glass substrate or superstrate to provide a random scale textured surface; and
    b) forming a thin silicon film on the textured surface and forming a photovoltaic device structure in the thin silicon film, the thin silicon film being less than 10 µm thick.

2. The method as claimed in claim 1, wherein the thin film silicon solar cell is formed in a thin film crystalline silicon.

3. The method as claimed in claim 1, wherein the thin film silicon solar cell is formed in an amorphous silicon thin film which is formed on a TCO layer.

4. The method as claimed in claim 1, wherein the etching step is performed to produce surface texturing including small scale features having dimensions in the range of from 0.05–0.5 times the thickness of the thin silicon film.

5. The method as claimed in claim 4, wherein the etching step is performed to produce small scale surface features having dimensions filling in the range of from 0.01 µm to less than 5 µm.

6. The method as claim in claim 4, wherein the etching step is performed to produce small scale surface features having dimensions falling in the range of 0.05–2 µm.

7. The method as claimed in claim 4, wherein the etching step is performed to produce small scale surface features having dimensions falling in the range of 0.1–1 µm.

8. The method as claimed in claim 4, wherein the etching step is performed to produce large scale features which have dimensions greater than the thickness of the thin silicon film and upon which the small scale features are superimposed.

9. The method as claimed in claim 8, wherein the large scale features have dimensions in the range of 1–10 µm.

10. The method as claimed in claim 8, wherein the large scale features have dimensions in the range of 2–5 µm.

11. The method as claimed in claim 4, wherein a thermal treatment is applied after the etching step and before the thin silicon film is formed, the thermal treatment comprising heating the substrate or superstrate to round off angular edges of the surface features.

12. The method as claimed in claim 4, wherein after the etching step, a thin conformal barrier layer is formed prior to forming the thin silicon film.

13. The method as claimed in claim 4, wherein after the etching step is completed, a spin-on glass layer is applied over the surface features, and heated to form a dielectric coating, to round off angular edges of the surface features.

14. The method as claimed in claim 13, wherein after the step of applying the spin-on glass layer, a thin conformal barrier layer is formed prior to forming the thin silicon film.

15. The method as claimed in claim 12, wherein the barrier layer is applied with a thickness equal to one quarter wavelength of light in the barrier layer material ±20%.

16. The method as claimed in claim 15, wherein the barrier layer material is silicon nitride with a thickness of 70 nm±20%.

17. The method as claimed in claim 4, wherein the etching step is performed by applying an etching composition to the surface of the substrate or superstrate, the etching composition comprising HF or a derivative of HF.

18. The method as claimed in claim 4, wherein the thin silicon film formed over the textured surface has a thickness in the range of 5–10 times the average height of the features of the surface texturing.

19. The method as claimed in claim 7, wherein the thin silicon film formed over the textured surface has a thickness in the range of 1–2 μm.

20. The method as claimed in claim 4, wherein after the silicon film is formed, a reflective material layer is formed over a surface of the silicon film remote from the substrate or superstrate.

21. The method as claimed in claim 20, wherein an insulating layer is formed over the surface of the silicon film remote from the substrate or superstrate prior to formation of the reflective material layer.

22. The method as claimed in claim 20, wherein the reflective material layer also forms a metallisation structure to contact the active regions of the cell.

23. A thin film photovoltaic device incorporating a light trapping structure, wherein the photovoltaic device is formed on a textured surface of a glass substrate or superstrate, the photovoltaic device comprising a thin silicon film into which is formed at least one pn photovoltaic junction, the thin silicon film being less than 10 μm thick and the texturing on the glass surface having random scale etching.

24. The device as claimed in claim 23, wherein the thin silicon film is a crystalline silicon thin film.

25. The device as claimed in claim 23, wherein the thin silicon film is an amorphous silicon thin film formed over a TCO layer.

26. The device as claimed in claim 23, wherein the textured surface of the substrate or superstrate includes features having dimensions, in the range of from 0.05–0.5 times the thickness of the thin silicon film.

27. The device as claimed in claim 26, wherein the textured surface has small scale surface features having dimensions falling in the range of 0.01 μm to less than 5 μm.

28. The device as claimed in claim 26, wherein the textured surface has small scale surface features having dimensions falling in the range of 0.05–2 μm.

29. The device as claimed in claim 26, wherein the textured surface has small scale surface features having dimensions falling in the range of 0.1–1 μm.

30. The device as claimed in claim 26, wherein the textured surface has large scale features which have dimensions greater than the thickness of the silicon film and upon which the small scale features are superimposed.

31. The device as claimed in claim 30, wherein the large scale features have dimensions in the range of 1–10 μm.

32. The device as claimed in claim 30, wherein the large scale features have dimensions in the range of 2–5 μm.

33. The device as claimed in claim 26, wherein the surface features of the textured surface have been rounded by heating the substrate or superstrate to its melting point.

34. The device as claimed in claim 26, wherein, a thin conformal barrier layer is located between the textured surface and the thin silicon film.

35. The device as claimed in claim 26, wherein a thin dielectric layer, derived from Sol-Gel glass, is located between the textured surface and the thin silicon film, to round off angular edges of the surface features.

36. The device as claimed in claim 35, wherein a thin conformal barrier layer is located between the dielectric layer and the thin silicon film.

37. The device as claimed in claim 34, wherein the barrier layer has a thickness equal to one quarter wavelength of light in the barrier layer material ±20%.

38. The device as claimed in claim 37, wherein the barrier layer material is silicon nitride with a thickness of 70 nm±20%.

39. The device as claimed in claim 26, wherein the thin silicon film formed over the textured surface has a thickness in the range of 5–10 times the average height of the features of the surface texturing.

40. The device as claimed in claim 23, wherein a reflective material layer is located over a surface of the silicon film remote from the substrate or superstrate.

41. The device as claimed in claim 40, wherein an insulating layer is located between the silicon film and the reflective material layer.

42. The device as claimed in claim 41, wherein the reflective material layer also forms a metallisation structure to contact the active regions of the photovoltaic device.

* * * * *